(12) United States Patent
Stickelmann et al.

(10) Patent No.: US 8,717,038 B2
(45) Date of Patent: May 6, 2014

(54) WIRING TESTING DEVICE

(75) Inventors: Uwe Stickelmann, Kaufungen (DE); Christian Bode, Rollshausen (DE); Benedikt Kuenzel, Geisleden (DE); Henrik Wolf, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 135 days.

(21) Appl. No.: 13/289,632

(22) Filed: Nov. 4, 2011

(65) Prior Publication Data

US 2012/0074953 A1 Mar. 29, 2012

Related U.S. Application Data

(63) Continuation of application No. PCT/EP2010/056077, filed on May 5, 2010.

(30) Foreign Application Priority Data

May 5, 2009 (EP) ..................................... 09006104

(51) Int. Cl.
*G01R 31/02* (2006.01)

(52) U.S. Cl.
USPC ......................................... 324/537; 324/522

(58) Field of Classification Search
USPC ............................... 324/537, 522; 361/42–50
See application file for complete search history.

(56) References Cited

U.S. PATENT DOCUMENTS

| | | | |
|---|---|---|---|
| 4,806,929 A * | 2/1989 | Nishijima et al. | 340/3.21 |
| 7,053,626 B2 | 5/2006 | Monter et al. | |
| 2005/0134288 A1 | 6/2005 | Monter et al. | |
| 2009/0296289 A1 * | 12/2009 | Valdez et al. | 361/47 |

FOREIGN PATENT DOCUMENTS

| | | |
|---|---|---|
| DE | 53803 B1 | 4/1970 |
| DE | 3248008 A1 | 6/1984 |
| DE | 102004008994 A1 | 10/2005 |
| DE | 102006009360 B3 | 7/2007 |
| DE | 102007046921 A1 | 4/2009 |
| EP | 0537066 A1 | 4/1993 |
| WO | 03017460 A1 | 2/2003 |
| WO | 2006126003 A1 | 11/2006 |
| WO | 2008152466 A2 | 12/2008 |

OTHER PUBLICATIONS

European Search Report Dated Nov. 23, 2009 for Application No. EP09006104.5. 5 Pages.
International Search Report Dated Jul. 20, 2010 for Application No. PCT/EP2010/056077. 13 Pages.

* cited by examiner

*Primary Examiner* — Vincent Q Nguyen
(74) *Attorney, Agent, or Firm* — Eschweiler & Associates, LLC

(57) ABSTRACT

A wiring testing device configured to test the wiring correctness of an inverter is disclosed. The inverter is configured to be connected to a low-voltage three-phase system with a neutral conductor serving as a reference point for grid-side conductor voltages. The wiring testing device includes a test circuit configured to measure the grid-side conductor voltages and determine an average value from the sum of the instantaneous values of the grid-side conductor voltages, and a display unit configured to display an error message if the average value exceeds a threshold voltage for a defined time period. The wiring testing device further includes a capacitor connected between a phase of the three-phase system and the neutral conductor configured to generate a voltage imbalance if the neutral conductor connection is missing, wherein the test circuit is configured to measure the conductor voltages and determine the voltage imbalance.

15 Claims, 3 Drawing Sheets

WIRING TESTING DEVICE

REFERENCE TO RELATED APPLICATIONS

This application is a continuation of International Application No. PCT/EP2010/056077, filed May 5, 2010, which claims priority to European Patent Application No. 09006104.5, filed May 5, 2009.

FIELD

The invention relates to a device for testing the wiring, i.e. the wiring connection, of an inverter, such as a photovoltaic inverter, that serves to convert direct voltage into three-phase alternating voltage in a power grid. The inverter is configured to be connected to a low-voltage three-phase system with a neutral conductor serving as the reference point for grid-side conductor voltages.

BACKGROUND

Only a qualified installer is allowed to connect a three-phase inverter to the power grid. It is necessary that the installer connects the various phases and the neutral conductor to the power grid in a correct and corresponding manner. However, the wiring procedure may result in wiring errors.

A method for automatically localizing single-phase ground faults in a medium-voltage grid has already been documented in DE 692 19 055 T2. This method involves measuring zero currents and generating vector sums. It also involves monitoring single currents and vector sums for phase shifts.

To detect ground faults in high-voltage grids with a resonance point grounding and an arc suppression coil, DE 10 2004 008 994 B4 proposes the use of a voltage imbalance to detect errors.

Documentation is also available (e.g., DD 053 803 B1) on testing devices that are used to connect, in pulses, a capacitor between a ground faulted phase and a protective conductor and measure the current that flows through it. This allows the devices to identify ground-faulted elements in a three-phase system. Other testing devices such as those documented in DE 10 2006 009 360 B3 are used to determine the direction of a rotary field. These devices also have a capacitor installed between the phase and neutral conductor.

DE 101 39 860 A1 documents a method for identifying a faulty connection in a three-phase device. Connection errors are identified by means of dq transformation.

For testing missing or transposed connections in Schuko sockets, DE 32 48 008 A1 proposes the use of a test circuit for connection faults.

An insulation monitoring circuit with a capacitive divider has already been documented in WO 2008 152 466 A2.

SUMMARY

The present invention provides an easy way to check a grid connection for wiring errors when connecting a three-phase inverter to the power grid.

The invention provides an easy way to monitor the connection to a low-voltage three-phase system with a neutral conductor.

In particular, the testing device automatically detects errors during PV inverter installation and thus provides the installer with a convenient and easy way to check the grid connection. The testing device can be integrated in the inverter (e.g., inside the inverter housing) or can be an external circuit (e.g., in the form of an external testing device).

This test is performed with few measuring points and a simple test circuit and may allow to reduce the number of components to obtain a solution that is both suitable for serial production and cost-effective at the same time.

When wiring the three-phase inverter, errors such as the missing connection of one or two phases, the transposition of a phase and a neutral conductor or a missing neutral conductor may occur.

Five error cases may arise: Case 1: The three-phase system is not connected to the inverter properly. Case 2: A phase of the three-phase system is not connected to the inverter. Case 3: Two phases of the three-phase system are not connected to the inverter. Case 4: The neutral conductor of the three-phase system is not connected to the inverter. Case 5: A phase and the neutral conductor of the three-phase system are connected to the inverter in a transposed manner.

The sum of the conductor voltages in a three-phase system equals zero in the case that all the conductors are properly connected. If one of the conductor voltages is missing due to improper wiring, then the voltage sum is a nonzero value.

If the variable Usum for a specific time tEπ-or exceeds a threshold of UEΓYOI-, an error message will be displayed informing the installer that a grid connection error is present.

This principle can be used to uniquely identify error cases 2, 3, and 5 by use of a single variable for monitoring.

To identify the missing neutral conductor (error case 4), an additional component is embedded between an inverter phase and the neutral conductor terminal in the inverter in accordance with one embodiment of the invention. When connecting the neutral conductor of the three-phase system to the inverter, a current flows back into the power grid via the phase, the component and the neutral conductor. A neutral conductor that is already connected specifies the neutral point and consequently prevents any voltage imbalance.

If however the neutral conductor is not connected, the current cannot flow back into the power grid via the additional component and the neutral conductor. In this case the embedded component generates an imbalance that can be detected by measuring the conductor voltages. This imbalance shifts the neutral point to the extent that the voltage applied to the component differs from the voltage that is present when the neutral conductor is properly wired. The difference in these voltages can be used to determine whether the neutral conductor is missing. Given that all phase or conductor voltages are measured to find the total sum, no additional effort is necessary for this voltage measurement.

In one embodiment the additional component is configured as a passive component. For reasons of cost, potential loss and complexity, it is advantageous in one embodiment to provide a capacitor as a passive component.

This capacitor may be dimensioned in a way that the capacitive current flowing between the phase and the neutral conductor of the three-phase system should be as small as possible but high enough to generate an imbalance in the conductor voltages under rated operation with grid voltage.

In another embodiment the passive component may be a resistor. In a further embodiment the additional component, especially the capacitor, may be connected via a switch for the sole purpose of testing. This option would require an additional control unit.

To determine whether the inverter is connected to the three-phase system properly (case 1), capacitors are symmetrically connected to all phases, for example in a star-shaped pattern. The additional capacitor is connected in parallel to one of the capacitors.

In another embodiment two serially-connected relay contacts may be arranged between the inverter and power grid for each phase wherein for each phase a voltage measurement is performed in-between the two corresponding relay contacts. This enables a standards-compliant electrical isolation from the power grid, which is also provided when a contact is welded to one of the two relays. In this embodiment, at least one capacitor is arranged between a relay contact and a connection terminal.

In one embodiment the inverter is configured to connect to the grid only upon absence of an alarm signal.

In one embodiment the device further comprises a display configured to display a message upon presence of the alarm signal.

BRIEF DESCRIPTION OF THE DRAWINGS

The accompanying drawings are included to provide a further understanding of the present invention and are incorporated in and constitute a part of this specification. The drawings illustrate embodiments of the present invention and together, with description serve to explain principles of the invention. In the drawings.

DETAILED DESCRIPTION

Figure 1:
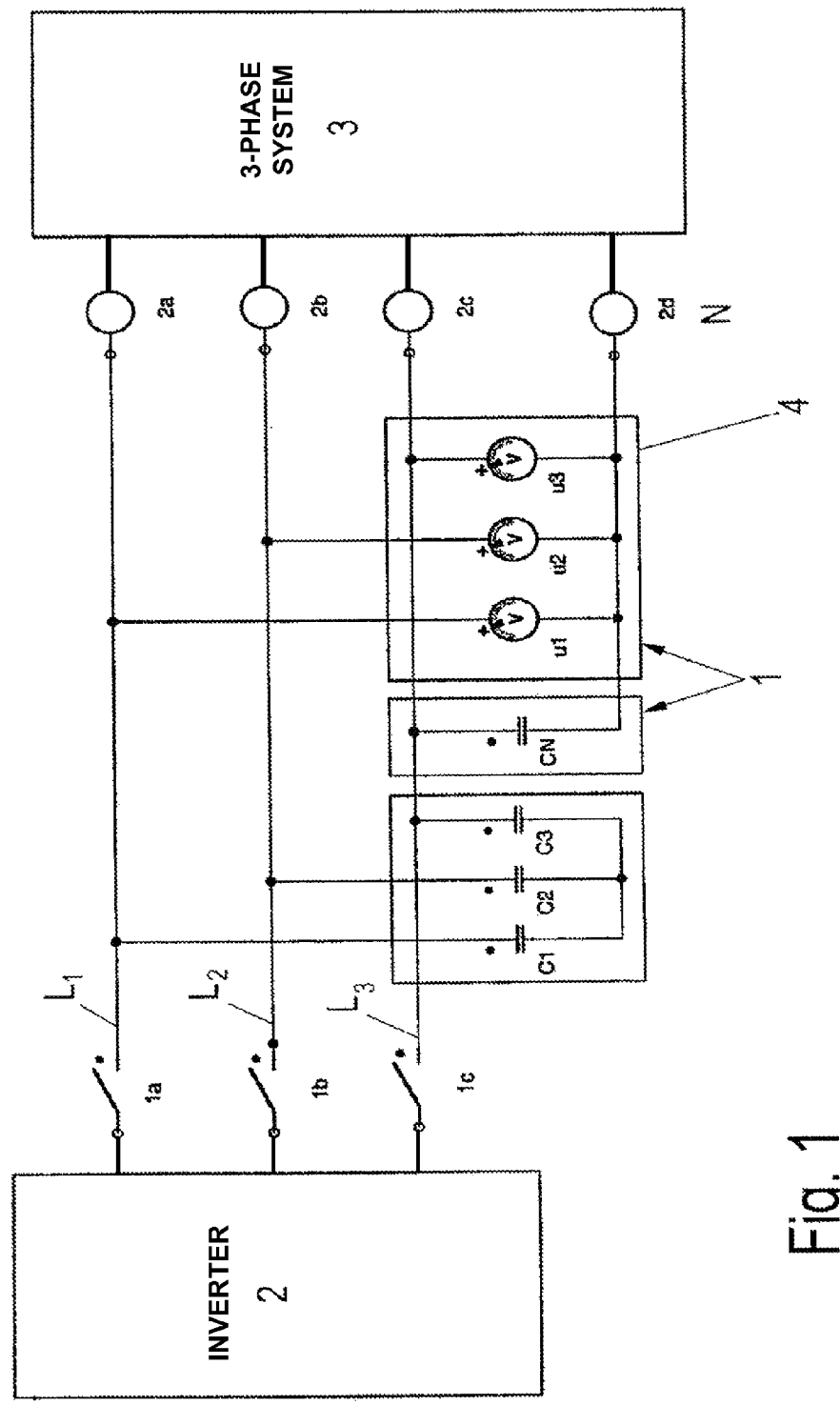
FIG. 1 shows a first embodiment of a wiring testing device.

FIG. 1 depicts a wiring testing device 1 configured to test the wiring connection, i.e. wiring correctness of an inverter 2, for example a photovoltaic inverter.

The inverter 2 is configured to be connected to a low-voltage three-phase system 3 with grid-side conductor voltages, i.e. phase voltages, u-i, $U_2$, $U_3$ (phases L1, L2 and L3) and a neutral conductor N. Three phase voltages in, $U_2$, $U_3$ are present (the N conductor serving as the reference point for the phase voltages u-i, $U_2$, $U_3$) and measured. A test circuit 4 is provided to measure the conductor voltages u-i, $U_2$, $U_3$.

In one embodiment of the invention an average value is derived from the sum of instantaneous values of the conductor voltages u-i, $U_2$, $U_3$. The sum is determined based on one grid cycle. An error message may appear if the total voltage exceeds a threshold voltage over a defined time period.

This embodiment uses the measurement of the grid-side conductor or phase voltages that are already used e.g. for a functional test of grid relays. The modulus of the sum of instantaneous values is calculated. This amount is averaged over one grid cycle.

$$UsumHW(k)=I\ Ui(k)+U_2(k)+U_3(k)I$$

$$Usum=[UsumHW(k)+UsumHW(k-1)]/\text{Norid cycle}$$

If the variable $U_{su}$m for a specific time $t_{Er}$ror exceeds a threshold of $U_E$rror, an error message will be displayed informing the installer that a grid connection fault is present.

With this method, the following error cases can be identified:

A phase of the three-phase system is not connected to the inverter.

Two phases of the three-phase system are not connected to the inverter.

A phase and the neutral conductor of the three-phase system are connected to the inverter in a transposed manner.

Only one variable is required for monitoring.

As depicted in FIG. 1, an additional passive component—a capacitor CN—is connected between L3 and the neutral conductor N. The component CN generates a voltage imbalance if the neutral conductor connection is missing. This imbalance can be determined by measuring the conductor voltages and an error message will also appear if the neutral conductor connection is found missing. In addition, three capacitors C1, C2, and C3 are symmetrically connected to all phases L1, L2, L3 in a star-shaped pattern. The additional capacitor CN is connected directly or by additional components like an additional capacitor between L3 and the neutral conductor N.

The connecting point between the capacitors C1, C2 and C3 may additionally be connected to earth (PE, not shown) by an additional capacitor (not shown here).

Relay contacts 1a, 1b, 1c, that are serially connected to connection terminals 2a, 2b, 2c for each of the phases L1-L3, are arranged between the inverter 2 and the power grid 3. Voltage measurements u-i, $U_2$, $U_3$ (voltage sensors of test circuit 4) are conducted between each of the phases L1, L2, L3 and the neutral conductor N.

The capacitors C1, C2, C3 and CN are wired to the relay contacts 1a, 1b, 1c on the grid side.

In another embodiment operation amplification circuits, that are not depicted in the figure, will be used to measure conductor voltages u-i, $U_2$, $U_3$. A signal processor may be used to calculate the sum of conductor voltages ui-$U_3$.

Figure 2:
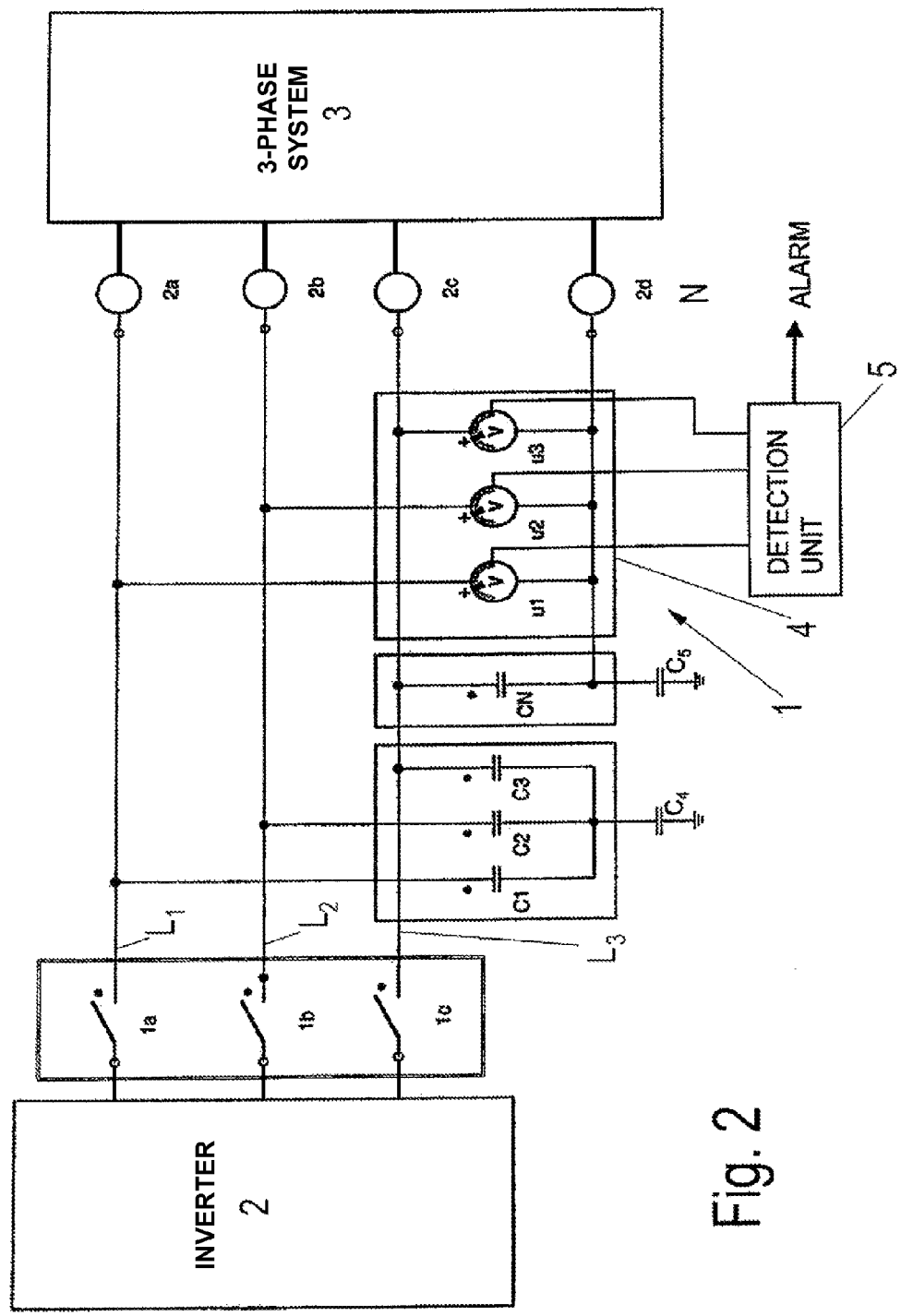
FIG. 2 another embodiment of a wiring testing device.

As shown in FIG. 2, another advantageous embodiment of a device for testing the wiring connection of an inverter 2 to a three-phase grid 3 with a neutral line may comprise the following features:

phase voltage sensors—i.e. voltage measurement devices—configured to determine voltages u-i, $U_2$, $U_3$ between corresponding ones of each of the three phases L1, L2, L3 and the neutral line N;

a detection unit 5 coupled to the phase voltage sensors and configured to issue an alarm signal in case the sum of the voltages of the phase voltage sensors exceeds a voltage threshold; and—an additional component connected between one of the three phases and the neutral line; the additional component being a capacitor CN.

This devices provides an uncomplicated and easy way of testing the wiring, i.e. the wiring correctness of the inverter 2 to the three-phase grid (system) 3. In one embodiment the device comprises two capacitors (CN, $C_5$) connected in series between one of the three phases and ground potential, and wherein the neutral line is connected between the two capacitors. Further, the connection by the additional component is in another embodiment a switchable connection.

Figure 3:
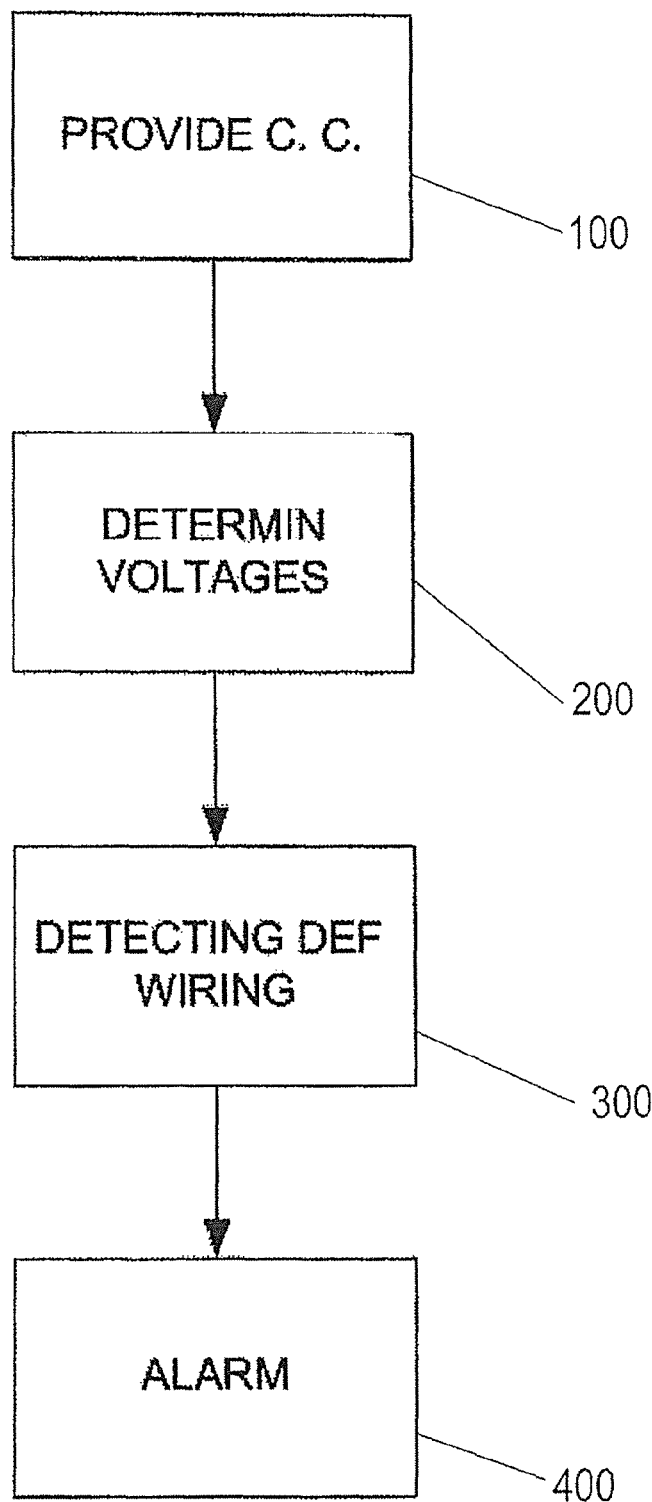
FIG. 3 a flow chart of a method for testing the wiring connection of an inverter.

FIG. 3 shows a flow chart of an embodiment of a method for testing the wiring connection of an inverter to a three-phase grid with a neutral line, the method comprising: providing an additional component (CC.) connected between one of the three phases L1, L2, L3 and the neutral line N at 100; determining phase voltages u-i, $U_2$, $u_3$ between a corresponding one of each of the three phases L1, L2, L3 and the neutral line N at 200; detecting a defective wiring connection by comparing a sum of the phase voltages to a voltage threshold at 300; and issuing an alarm signal upon detection of a defective wiring at 400.

In one embodiment, at 300 comparing a sum of the phase voltages to a voltage threshold comprises averaging a sum of the phase voltages over a period of time. In one embodiment, the period of time is an integer number of grid cycles.

What is claimed is:
1. A wiring testing device configured to test the wiring correctness of an inverter, that serves to convert a direct voltage into a three-phase alternating current, the inverter configured to be connected to a low-voltage three-phase sys- tem with a neutral conductor serving as a reference point for grid-side conductor voltages, comprising:
- a test circuit configured to measure the grid-side conductor voltages and determine an average value from the sum of the instantaneous values of the grid-side conductor voltages;
- a display unit configured to display an error message if the average value exceeds a threshold voltage for a defined time period; and
- a capacitor connected between a phase of the three-phase system and the neutral conductor configured to generate a voltage imbalance if the neutral conductor connection is missing,
- wherein the test circuit is configured to measure the conductor voltages and determine the voltage imbalance, and
- wherein the display unit is configured to generate an error message if the neutral conductor connection is found missing.

2. A device for testing the wiring connection of an inverter to a three-phase grid with a neutral line, the device comprising:
- phase voltage sensors configured to determine voltages between corresponding ones of each of the three phases of the three-phase grid and the neutral line;
- a detection unit coupled to the phase voltage sensors and configured to issue an alarm signal in case a sum of the voltages of the phase voltage sensors exceeds a voltage threshold; and
- a capacitor connected between one of the three phases and the neutral line.

3. The device according to claim 2, further comprising additional capacitors symmetrically connected to all phases of the three-phase grid, respectively.

4. The device according to claim 3, wherein the additional capacitors are connected together in a star-shaped pattern.

5. The device according to claim 2, further comprising another capacitor connected in series with the capacitor, and together connected between one of the three phases and a ground potential, and wherein the neutral line is connected between the two capacitors.

6. The device according to claim 2, wherein the capacitor is switchably connected between the one of the three phases and the neutral line.

7. The device according to claim 2, further comprising relay contacts serially connected to respective connection terminals between the inverter and the three-phase grid for each phase.

8. The device according to claim 7, further comprising an additional capacitor arranged between a point between each relay contact and the respective connection terminal and a common connection terminal, respectively.

9. The device according to claim 2, further comprising operation amplification circuits operably associated with the phase voltage sensors, and configured to amplify the voltages associated with each of the three phases.

10. The device according to claim 2, further comprising a signal processor configured to calculate the sum of the voltages of the phase voltage sensors.

11. The device according to claim 2, wherein the inverter is configured to connect to the three-phase grid only upon absence of the alarm signal.

12. The device according to claim 2, further comprising a display configured to display a message upon presence of the alarm signal.

13. A method for testing the wiring connection of an inverter to a three-phase grid with a neutral line, the method comprising:
- providing a capacitor connected between one of the three phases of the three-phase grid and the neutral line;
- determining phase voltages between a corresponding one of each of the three phases and the neutral line;
- detecting a defective wiring connection by comparing a sum of the phase voltages to a voltage threshold; and
- issuing an alarm signal upon detection of the defective wiring.

14. The method of claim 13, wherein the sum of the phase voltages comprises an average of the sum of the phase voltages over a period of time.

15. The method of claim 14, wherein the period of time is an integer number of grid cycles.

* * * * *